United States Patent
Huang et al.

(10) Patent No.: US 8,968,525 B2
(45) Date of Patent: Mar. 3, 2015

(54) METHODS OF FLASH REDUCTION AND PATTERNING OF GRAPHITE OXIDE AND ITS POLYMER COMPOSITES

(75) Inventors: Jiaxing Huang, Evanston, IL (US); Laura Cote, Chicago, IL (US); Rodolfo Cruz Silva, Evanston, IL (US)

(73) Assignee: Northwestern University, Evanston, IL (US)

( * ) Notice: Subject to any disclaimer, the term of this patent is extended or adjusted under 35 U.S.C. 154(b) by 1259 days.

(21) Appl. No.: 12/714,955

(22) Filed: Mar. 1, 2010

(65) Prior Publication Data
US 2010/0221508 A1    Sep. 2, 2010

Related U.S. Application Data

(60) Provisional application No. 61/156,065, filed on Feb. 27, 2009.

(51) Int. Cl.
| | | |
|---|---|---|
| C01B 31/00 | (2006.01) | |
| C01B 31/04 | (2006.01) | |
| B82Y 30/00 | (2011.01) | |
| B82Y 40/00 | (2011.01) | |
| G03F 7/004 | (2006.01) | |
| G03F 7/20 | (2006.01) | |
| H01B 1/04 | (2006.01) | |
| H01B 1/24 | (2006.01) | |

(52) U.S. Cl.
CPC .............. *C01B 31/0476* (2013.01); *B82Y 30/00* (2013.01); *B82Y 40/00* (2013.01); *G03F 7/0042* (2013.01); *G03F 7/2004* (2013.01); *H01B 1/04* (2013.01); *H01B 1/24* (2013.01)

USPC ..................................................... 204/157.47

(58) Field of Classification Search
CPC ........ B01J 19/12; B01J 19/121; B01J 19/122; B01J 19/123; B01J 19/127; C01B 31/0438; C01B 31/0446; C01B 31/0476; B82Y 30/00; B82Y 40/00
USPC ............................. 204/157.41, 157.47, 157.4
See application file for complete search history.

(56) References Cited

U.S. PATENT DOCUMENTS

| | | | |
|---|---|---|---|
| 6,828,015 B2 | 12/2004 | Hirata et al. | |
| 7,015,142 B2 * | 3/2006 | DeHeer et al. | ............... 438/689 |

(Continued)

OTHER PUBLICATIONS

Williams et al. "TiO2-Graphene Nanocomposites. UV-Assisted Photocatalytic Reduction of Graphene Oxide", ACS Nano, 2008, vol. 2, p. 1487-1491.*

(Continued)

*Primary Examiner* — Gerard Higgins
(74) *Attorney, Agent, or Firm* — Morris, Manning & Martin, LLP; Tim Tingkang Xia, Esq.

(57) ABSTRACT

A method of reducing a film of graphite oxide. In one embodiment, the method includes the steps of providing a film of graphite oxide with a thickness $d_0$; and delivering optical energy in a single pulse to the film of graphite oxide at a distance no more than 1.0 cm away from the film of graphite oxide to reduce the film of graphite oxide to a film of graphene with a thickness d, wherein the optical energy has a radiant exposure in the range of between 0.1 and 2 $J/cm^2$, and wherein the thickness d is greater than the thickness $d_0$. In one embodiment, the thickness $d \geq 10 \times d_0$.

35 Claims, 11 Drawing Sheets
(7 of 11 Drawing Sheet(s) Filed in Color)

(56) References Cited

U.S. PATENT DOCUMENTS

| | | | |
|---|---|---|---|
| 8,173,095 B2 * | 5/2012 | de Heer et al. | 423/448 |
| 8,317,984 B2 * | 11/2012 | Gilje | 204/157.47 |
| 2003/0186059 A1 | 10/2003 | Hirata et al. | |
| 2007/0160842 A1 | 7/2007 | Hirata et al. | |
| 2009/0236609 A1 * | 9/2009 | de Heer et al. | 257/77 |

OTHER PUBLICATIONS

Masuhara et al. "Dopant-Induced Ablation of Poly(methyl methacrylate) by a 308-nm Excimer Laser", Macromolecules, 1987, 20, p. 450-452.*

Encyclopedia of Polymer Science and Engineering, vol. 16, John Wiley & Sons, New York, 1989, p. 1-5.*

Ya-Ping Sun et al., Functionalized Carbon Nanotubes: Properties and Applications, Accounts of Chemical Research, 2002, p. 1096-1104, vol. 35, No. 12.

Héctor A. Becerril et al., Evaluation of Solution-Processed Reduced Graphene Oxide Films as Transparent Conductors, AcsNano, 2008, p. 463-470, vol. 2, No. 3.

Sarbajit Banerjee et al., Covalent Surface Chemistry of Single-Walled Carbon Nanotubes, Advanced Materials, Jan. 6, 2005, p. 17-29, vol. 17, No. 1.

Thomas Leitner et al., Infrared Reflection Spectroscopy of Thin Films on Highly Oriented Pyrolytic Graphite, Applied Spectroscopy, 2003, p. 1502-1509, vol. 57, No. 12.

Hiroyuki Fujimoto, Theoretical X-ray scattering intensity of carbons with turbostratic stacking and AB stacking structures, Carbon, 2003, p. 1585-1592, vol. 41.

Sasha Stankovich et al., Synthesis of graphene-based nanosheets via chemical reduction of exfoliated graphite oxide, Carbon, 2007, p. 1558-1565, vol. 45.

N. Kovtyukhova et al., Ultrathin Supported Graphite Oxide and Carbon Films, Carbon, 1998, p. 549-554, vol. 36, No. 5-6.

Tsuyoshi Nakajima et al., Formation Process and Structure of Graphite Oxide, Carbon, 1994, p. 469-475, vol. 32, No. 3.

T. Nakajima et al., A New Structure Model of Graphite Oxide, Carbon, 1988, p. 357-361, vol. 26, No. 3.

William S. Hummers et al., Preparation of Graphitic Oxide, Mar. 20, 1958, p. 1339.

Jiaxing Huang et al., Polyaniline Nanofibers: Facile Synthesis and Chemical Sensors, J. Am. Chem. Soc., 2003, p. 314-315, vol. 125, No. 2.

Yuxi Xu et al., Flexible graphene films via the filtration of water-soluble noncovalent functionalized graphene sheets, J. Am. Chem. Soc., 2008, p. 5856-5857, vol. 130, No. 18.

Laura J. Cote et al., Langmuir-Blodgett Assembly of Graphite Oxide Single Layers, J. Am. Chem. Soc., 2009, p. 1043-1049, vol. 131, No. 3.

Hannes C. Schniepp et al., Functionalized single graphene sheets derived from splitting graphite oxide, The journal of physical chemistry B letters, 2006, p. 8535-8539, 2006, vol. 110, No. 17.

D. Zou et al., Model filled polymers. I. synthesis of crosslinked monodisperse polystyrene beads, Journal of polymer science: Part A: Polymer Chemistry, 1990, p. 1909-1921, vol. 28.

Jie Liu et al., Recent advances in methods of forming carbon nanotubes, Mrs Bulletin, Apr. 2004, p. 244-250.

N. Wang et al., Enhanced photothermal effect in Si nanowires, Nona Letters, 2003, p. 475-477, vol. 3, No. 4.

Scott Gilje et al., A chemical route to graphene for device applications, Nona Letters, 2007, p. 3394-3398, vol. 7, No. 11.

Cristina Gómez-Navarro et al., Electronic transport properties of individual chemically reduced graphene oxide sheets, Nona Letters, 2007, p. 3499-3503, vol. 7, No. 11.

Xuan Wang et al., Transparent, conductive graphene electrodes for dye-sensitized solar cells, Nona Letters, 2008, p. 323-327, vol. 8, No. 1.

Meryl D. Stoller et al., Graphene-based Ultracapacitors, Nona Letters, 2008, p. 3498-3502, vol. 8, No. 10.

Yongchao Si et al., Synthesis of water soluble graphene, Nona Letters, 2008, p. 1679-1682, vol. 8, No. 6.

Sasha Stankovich et al., Graphene-based composite materials, Nature, Jul. 2006, p. 282-286, vol. 442.

Dmitriy A. Dikin et al., Preparation and characterization of graphene oxide paper, Nature, Jul. 2007, p. 457-460, vol. 448.

Jiaxing Huang et al., Flash welding of conducting polymer nanofibres, Nature materials, Nov. 2004, p. 783-786, vol. 3.

Dan Li et al., Processable aqueous dispersions of graphene nanosheets, Nature nanotechnology, Feb. 2008, p. 101-105, vol. 3.

Goki Eda et al., Large-area ultrathin films of reduced graphene oxide as a transparent and flexible electronic material, Nature nanotechnology, May 2008, p. 270-274, vol. 3.

Vincent C. Tung et al., High-throughput solution processing of large-scale graphene, Nature nanotechnology, Jan. 2009, p. 25-29, vol. 4.

Jiaxing Huang et al., syntheses and applications of conducting polymer polyaniline nanofibers, Pure Appl. Chem., 2006, p. 15-27, vol. 78, No. 1.

P. M. Ajayan et al., Nanotubes in a flash-Ignition and reconstruction, Science, Apr. 2002, p. 708, vol. 296.

Weiwei Cai et al., Synthesis and solid-state NMR structural characterization of C-labeled graphite oxide, Science, Sep. 2008, p. 1815-1817, vol. 321.

Dan Li et al., Graphene-based materials, Science, May 2008, p. 11701171, vol. 320.

* cited by examiner

METHODS OF FLASH REDUCTION AND PATTERNING OF GRAPHITE OXIDE AND ITS POLYMER COMPOSITES

CROSS-REFERENCE TO RELATED PATENT APPLICATION

This application claims priority to and the benefit of, pursuant to 35 U.S.C. §119(e), U.S. provisional patent application Ser. No. 61/156,065, filed Feb. 27, 2009, entitled "FLASH CONVERSION OR REDUCTION OF GRAPHITE OXIDE TO GRAPHENE: PROCESSES AND APPLICATIONS," by Jiaxing Huang, Laura Cote and Rodolfo Cruz Silva, the contents of which is incorporated herein in its entirety by reference.

STATEMENT AS TO RIGHTS UNDER FEDERALLY-SPONSORED RESEARCH

This invention was made with government support under Grant No. SGER CMMI-0853572 awarded by the National Science Foundation. The government has certain rights in the invention.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, superscript "n" represents the nth reference cited in the reference list. For example, ( )[19] represents the 19th reference cited in the reference list, namely, Huang, J. X. *Pure Appl. Chem.* 2006, 78, 15-27.

FIELD OF THE INVENTION

The present invention relates generally to the reduction of graphite oxide and its polymer composites, in particular, to methods of flash reduction of graphite oxide and its polymer composites, and applications of same.

BACKGROUND

Graphite oxide (hereinafter referred as "GO") is a promising precursor for bulk production of graphene based materials because it can be synthesized in large quantities from cheap graphite powders.[1] It is usually made by reacting graphite with strong oxidants followed by gentle exfoliation.[2] The reaction derivatizes graphene sheets with carboxylic acid, phenol hydroxyl and epoxide groups, and thus breaks the π-conjugation in the two dimensional carbon networks.[3-5] Therefore, the resulting graphite oxide product is water dispersable, insulating and light brown in color. The insulating GO can be reduced to form chemically modified graphene (a.k.a. reduced GO, or "r-GO"), in which a large portion of oxygen containing functional groups are removed by reactions with chemicals reducing agents such as hydrazine or its derivatives,[6-11] or by thermal treatment in various inert or reducing atmospheres.[12-15] Such deoxygenating treatments could be challenging if GO is to be blended with other materials, such as with polymer composites since the polymer component may prevent the reducing agent from reacting with GO, or it may be unstable at the annealing temperature.

Therefore, a heretofore unaddressed need exists in the art to address the aforementioned deficiencies and inadequacies.

SUMMARY OF THE INVENTION

In one aspect, the present invention provides a method for reducing a film of graphite oxide. In one embodiment, the method includes the steps of (a) providing a film of graphite oxide with a thickness $d_0$; and (b) delivering optical energy in a single pulse to the film of graphite oxide at a distance no more than 1.0 cm away from the film of graphite oxide to reduce the film of graphite oxide to a film of graphene with a thickness d, wherein the optical energy has a radiant exposure in the range of between 0.1 and 2 J/cm$^2$, and wherein the thickness d is greater than the thickness $d_0$. In one embodiment, the thickness $d \geq 10 \times d_0$.

The optical energy is delivered in a single pulse from a light source. In one embodiment, the light source is a flash light, and the single pulse of the optical energy is a flash of light that irradiates the film of graphite oxide in a sufficient short period of time to cause a photoacoustic response from the film of graphite oxide to the irradiation of the flash of the light. The period of time during which the film of graphite oxide is exposed to the single flash of light is less than $1.0 \times 10^{-5}$ seconds.

In another aspect, the present invention provides an article of manufacture made by the method as set forth above.

In yet another aspect, the present invention provides a method for reducing a composite film of graphite oxide and polymer. In one embodiment, the method includes the steps of:

(a) providing a composite film of graphite oxide and polymer; and (b) delivering optical energy in a single pulse to the composite film of graphite oxide and polymer at a distance no more than 1.0 cm away from the composite film of graphite oxide and polymer to reduce the composite film of graphite oxide and polymer to a film of graphene and polymer, wherein the optical energy has a radiant exposure in the range of between 0.1 and 2 J/cm$^2$.

The optical energy is delivered in a single pulse from a light source. In one embodiment, the light source is a flash light, and the single pulse of the optical energy is a flash of light that irradiates the composite film of graphite oxide and polymer in a sufficient short period of time. The period of time during which the composite film of graphite oxide and polymer is exposed to the single flash of light is less than $1.0 \times 10^{-5}$ seconds.

In another aspect, the present invention provides an article of manufacture made by the method as set forth immediately above.

In a further aspect, the present invention provides a method for making a conductive film with a pattern from graphite oxide. In one embodiment, the method includes the steps of:

(a) providing a film of graphite oxide;

(b) over the film of graphite oxide placing a mask with a plurality of windows that are transparent to optical energy, wherein the plurality of windows is arranged according to a desired pattern; and (c) delivering optical energy in a single pulse to the mask to irradiate the film of graphite oxide by the optical energy passing through the plurality of windows of the mask at a distance no more than 1.0 cm away from the film of graphite oxide to reduce the film of graphite oxide to a conducting film of graphene with a pattern, wherein the optical energy has a radiant exposure in the range of between 0.1 and 2 $J/cm^2$, and wherein the thickness d is greater than the thickness $d_0$.

The optical energy is delivered in a single pulse from a light source. In one embodiment, the light source is a flash light, and the single pulse of the optical energy is a flash of light that irradiates the film of graphite oxide through the plurality of windows of the mask in a sufficient short period of time. The period of time during which the film of graphite oxide is exposed through the plurality of windows of the mask to the single flash of light is less than $1.0 \times 10^{-5}$ seconds.

In another aspect, the present invention provides an article of manufacture made by the method as set forth immediately above.

In yet another aspect, the present invention provides a method for making a conductive film with a pattern from composite film of graphite oxide and polymer. In one embodiment, the method includes the steps of:

(a) providing a composite film of graphite oxide and polymer;

(b) over the composite film of graphite oxide and polymer placing a mask with a plurality of windows that are transparent to optical energy, wherein the plurality of windows is arranged according to a desired pattern; and (c) delivering optical energy in a single pulse to the mask to irradiate the composite film of graphite oxide and polymer by the optical energy passing through the plurality of windows of the mask at a distance no more than 1.0 cm away from the composite film of graphite oxide and polymer to reduce the composite film of graphite oxide and polymer to a conducting film of graphene and polymer with a pattern, wherein the optical energy has a radiant exposure in the range of between 0.1 and 2 $J/cm^2$, and wherein the thickness d is greater than the thickness $d_0$.

The optical energy is delivered in a single pulse from a light source. In one embodiment, the light source is a flash light, and the single pulse of the optical energy is a flash of light that irradiates the composite film of graphite oxide and polymer through the plurality of windows of the mask in a sufficient short period of time. The period of time during which the composite film of graphite oxide and polymer is exposed through the plurality of windows of the mask to the single flash of light is less than $1.0 \times 10^{-5}$ seconds.

In another aspect, the present invention provides an article of manufacture made by the method as set forth immediately above.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The drawings described below are for illustration purposes only. The drawings are not intended to limit the scope of the present teachings in any way. The patent or application file may contain at least one drawing executed in color. If so, copies of this patent or patent application publication with color drawing(s) will be provided by the Office upon request and payment of the necessary fee.

DETAILED DESCRIPTION

Figure 1:
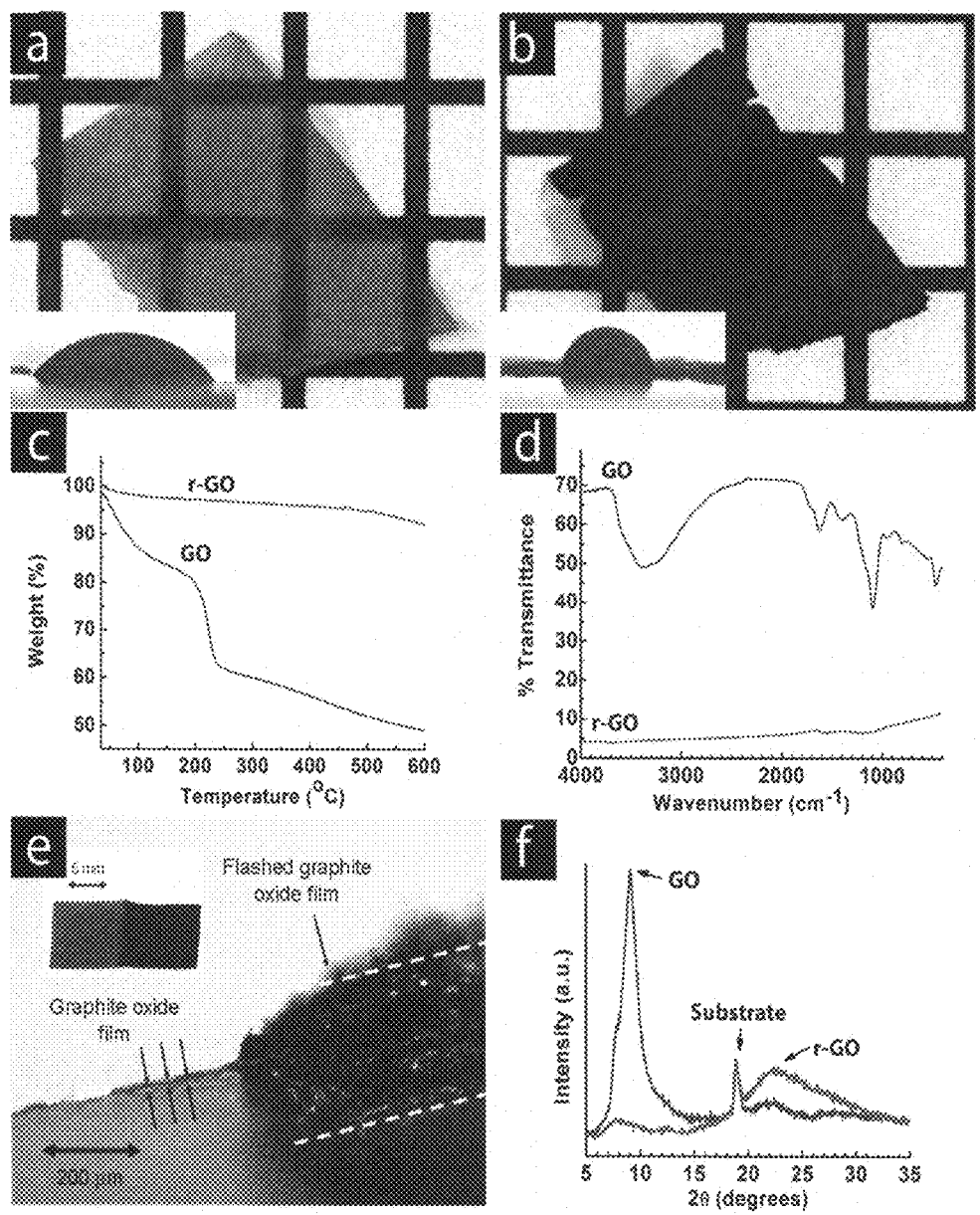
FIG. 1 shows a graphite oxide (GO) paper (a) can be instantaneously reduced (b) upon exposure to a photographic camera flash. The grids in the background are 1 mm×1 mm. The flash reduction of GO was evident by the dramatic changes in color (a, b), water contact angle (insets), (c) TGA and (d) FTIR. In (c-e), the blue lines correspond to GO and the red lines correspond to the flash reduced GO (r-GO). (e) Cross-sectional view of a GO paper showing large thickness expansion after flash reduction. Only the right half of the GO sample was flashed. The left part of the picture shows the cross-sectional view of the light brown colored GO film. The thickness increased by almost two orders of magnitude, resulting in a very fluffy and potentially high surface area film. (f) The lack of a graphitic peak in the XRD pattern of the reduced material suggests disordered packing of the r-GO sheets, consistent with the large volume expansion observed in (e).

The present invention is more particularly described in the following examples that are intended as illustrative only since numerous modifications and variations therein will be apparent to those skilled in the art. Various embodiments of the invention are now described in detail. Referring to the drawings, FIGS. 1-11, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, if any, the term "transmission electron microscopy (TEM)" refers to a microscopy technique whereby a beam of electrons is transmitted through an ultra thin specimen, interacting with the specimen as it passes through it. An image is formed from the electrons transmitted through the specimen, magnified and focused by an objective lens and appears on an imaging screen, a fluorescent screen in most TEMs, plus a monitor, or on a layer of photographic film, or to be detected by a sensor such as a CCD camera.

As used herein, if any, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "X-ray diffraction (XRD)" refers to a method of determining the arrangement of atoms within a crystal or solid, in which a beam of X-rays strikes a crystal and diffracts into many specific directions. From the angles and intensities of these diffracted beams, a crystallographer can produce a three-dimensional picture of the density of electrons within the crystal. From this electron density, the mean positions of the atoms in the crystal can be determined, as well as their chemical bonds, their disorder and various other information. In an X-ray diffraction measurement, a crystal or solid sample is mounted on a goniometer and gradually rotated while being bombarded with X-rays, producing a diffraction pattern of regularly spaced spots known as reflections. The two-dimensional images taken at different rotations are converted into a three-dimensional model of the density of electrons within the crystal using the mathematical method of Fourier transforms, combined with chemical data known for the sample.

As used herein, if any, the term "thermal gravimetric analysis (TGA)" refers to a type of testing that is performed on samples to determine changes in weight in relation to change in temperature. Such analysis relies on a high degree of precision in three measurements: weight, temperature, and temperature change. TGA is commonly employed in research and testing to determine characteristics of materials such as polymers, to determine degradation temperatures, absorbed moisture content of materials, the level of inorganic and organic components in materials, decomposition points of explosives, and solvent residues. It is also often used to estimate the corrosion kinetics in high temperature oxidation.

OVERVIEW OF THE INVENTION

The present invention provides, among other things, a room temperature, chemical-free flash reduction process where a flash, such as a photographic camera flash, instantaneously triggers the deoxygenation reaction of GO by photothermal heating. Flash irradiation also rapidly creates fused polymer composite from a random mixture of GO and polymer particles. Using a photo-mask, conducting patterns such as interdigitated electrode arrays can be readily made on flexible substrates by practicing the present invention.

FIGS. 1a and 1b show the dramatic color change in a GO film before and after flash reduction. Upon a close camera flash (within 1 cm), the brown, transparent film, as shown in FIG. 1a, instantaneously turned black and opaque, as shown in FIG. 1b, accompanied by a loud pop sound. The strong photoacoustic response suggested a rapid expansion of air near the surface of the film due to a heat pulse generated by photothermal energy conversion,[20] which effectively initiated the thermal deoxygenating reactions for reducing GO. The resulting black film became more hydrophobic (FIGS. 1a and b insets). The water contact angle of the GO film increased from about 45° to around 78° after flash, approaching the value measured on a piece of highly ordered pyrolytic graphite of 81°. This indicated the removal of the oxygen containing groups, which was confirmed by several characterization techniques. FIG. 1c shows the thermogravimetry analysis (TGA) heating curves of GO films before and after flash under $N_2$ atmosphere. GO showed mass loss of about 15% around 100° C. due to water removal, and a second mass loss of about another 25% around 220° C., which has been attributed to the loss of oxygen containing groups.[7] The thermal behavior of the flash reduced graphite oxide produced according to one embodiment of the present invention appeared the same as those made by high temperature annealing, with only <2% mass loss in the same temperature range.[7] Since the oxygenated functional groups are IR active, FTIR spectra, as shown in FIG. 1d, can give a qualitative measure of the deoxygenating reactions. The spectrum of the original GO film showed a rich collection of transmission bands corresponding to carboxylic acid (1630-1730 $cm^{-1}$), phenyl hydroxyl (around 1100 $cm^{-1}$) and epoxide groups (around 930 $cm^{-1}$),[7,13] all of which were nearly eliminated after flashing. The flashed film also showed much decreased transmission in the IR spectra, which is characteristic of electrically conducting carbon[21] that has been observed in HOPG. Elemental analysis showed that the C/O atomic ratio was increased from 1.15 for GO to 4.23 for flash reduced GO.

The GO films typically expanded tens of times after flash reduction due to rapid degassing (FIG. 1e). The thickness expansion of the flashed film suggested that the r-GO sheets were well exfoliated. This was confirmed by the X-ray diffraction (XRD) studies (FIG. 1f). There is only one sharp peak centered at 2θ=9.12° in the XRD pattern of the GO film, corresponding to a distance of 9.7 Å between the stacked GO sheets. This is consistent with the apparent thickness of a GO single layer, which was observed to be around 1 nm.[7,8,16,22] It also suggests that the starting materials, here the GO film, were free of unexfoliated or unreacted graphite. After flashing, the GO peak disappeared from the XRD pattern and a broad peak centered at 22.5° emerged, which is at a slightly lower angle than the peak for bulk graphite. The lack of a graphite peak suggests that the r-GO sheets stayed exfoliated and disorderly packed despite their strong pi-pi interaction.[23] This is because flash irradiation causes microscopically explosive reduction of GO that occurs in-situ in solid state. The density of flash converted graphene films were calculated to be around 0.14 $g/cm^3$, which is 6% of the value for bulk graphite. The conductivities of flash reduced GO films were measured to be around 1000 S/m using their much expanded thicknesses in the calculation. Note that the conductivity of reduced GO heavily depends on the processing history of the GO precursor, the reaction conditions and densities of the final products. Although much higher values of conductivities have been reported for GO coatings of tens of nanometers in thickness annealed at high temperature (>500° C.),[12,15] for GO papers prepared under similar conditions, flash reduction produces products with comparable conductivities to those from chemical or thermal treatments[7,9,13,14,24-26]. The open structure of the flash reduced GO films should make them useful for applications favoring high surface area.[25]

Figure 2:
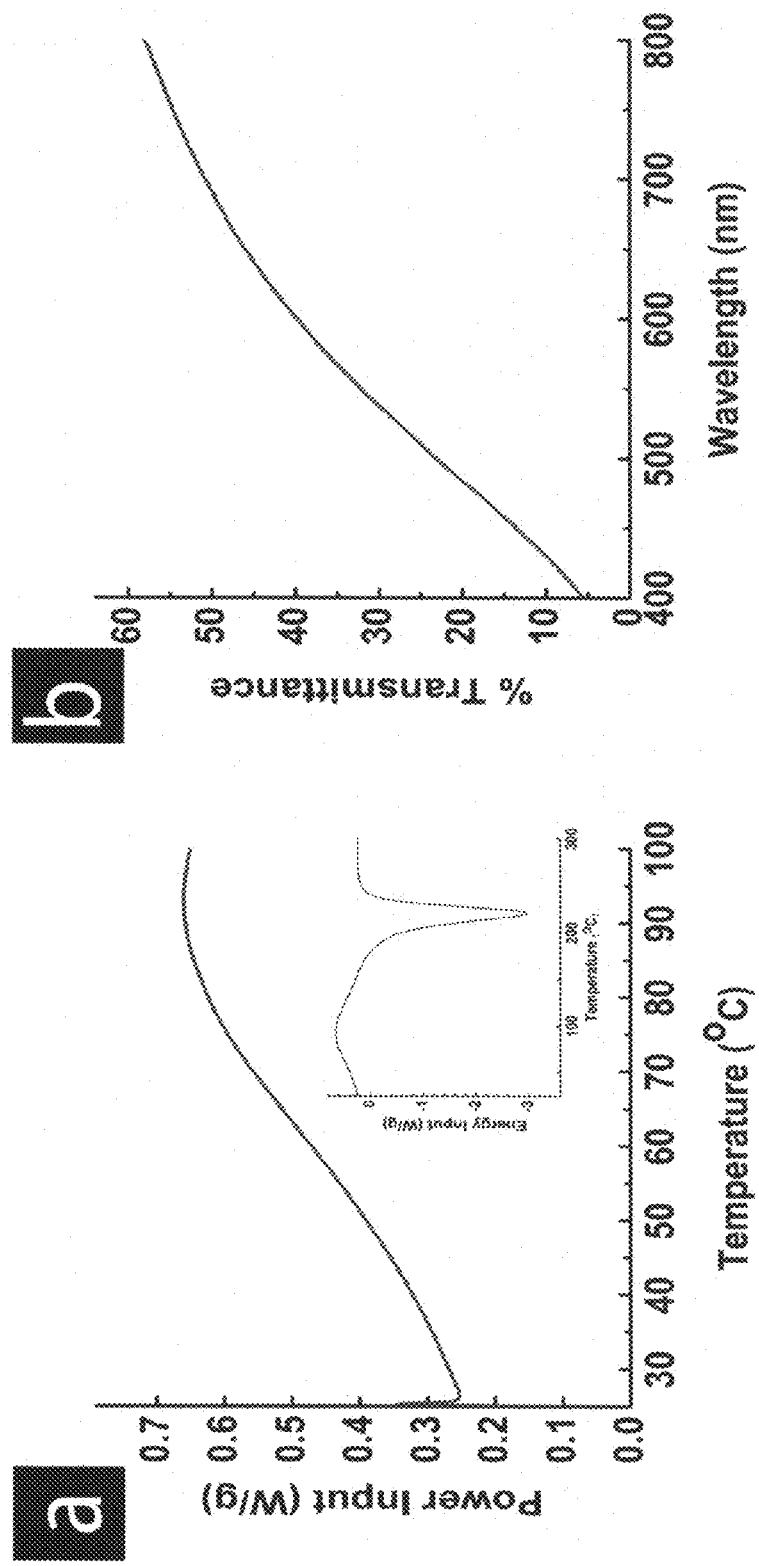
FIG. 2 shows energy analysis on the flash reduction of graphite oxide: (a) The close up of the DSC data (inset) shows the heating curve of GO up to 100° C. The total energy input can be calculated from the area under the heating curve. It took about 377 J/g (i.e., 70 $mJ/cm^2$) of thermal energy to heat up the GO film from room temperature. (b) UV/Vis spectrum of a 1 μm thick GO film. The average absorption over the visible range (400-800 nm) is 63%.

To understand the photothermal heating mechanism, it was further investigated the photo energy input from the camera flash unit and the thermal energy needed for heating GO films to thermal reduction temperature (FIG. 2). The photo energy emitted by the flash lamp used, for examples for results shown in FIG. 1 and FIG. 7, was measured to be around 1 $J/cm^2$ at close distances (<2 mm). Since the typical optical absorption of a 1 μm thick GO film is about 63% in the visible range, the total absorbed energy, E, is about 630 $mJ/cm^2$. Using differential scanning calorimetry (DSC), the total thermal energy required to heat a 1 μm thick GO to 100° C. is calculated to be about 70 $mJ/cm^2$. Note that this value already includes the extra energy needed to heat up and evaporate the 15% water in the GO film. Therefore, a single camera flash at this distance can provide 9 times the thermal energy needed for heating GO over 100° C., which should be more than enough a threshold value, $E_0$, to induce deoxygenating reactions. This suggests that flash irradiation could lead to a much higher degree of reduction of GO if the photothermal conversion and heat absorption by GO are optimized.

It was also found by practicing the present invention that much lower energy flashes (<200 $mJ/cm^2$, smallest f-stop value on the flash unit) can be used to convert films in a nitrogen atmosphere or pre-dried films due to the lower water content in the films. Since both the optical absorption and heat consumption scale with the film thickness, the thickness term is normalized in the above calculation. This indicates that flash reduction is thickness independent up to the absorption limit. Note that the reduction of GO darkens its color, which leads to higher optical absorption in the visible range. This provides a positive feedback in the photothermal process for further heating. Therefore, a camera flash, or a beam of light, can rapidly deliver more than enough energy to photothermally reduce GO.

Figure 3:
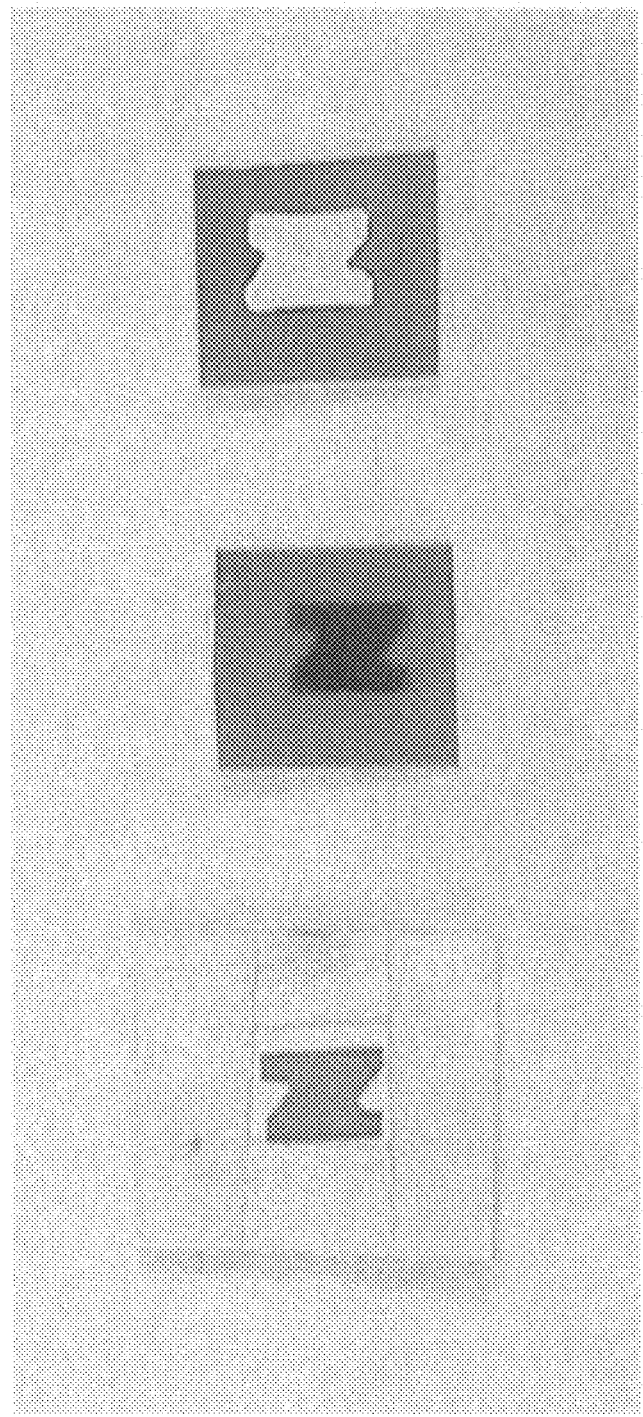
FIG. 3 shows dry flash lithography of GO. Left: A shadow mask defining an exposed area with "N" shape was taped onto a GO film supported by filter paper. Center: The black, N-shaped, r-GO pattern obtained after flash; Right: The exposed area was ablated by higher power flashes, leaving an etched "N" pattern on the film.

Since flash reduction is triggered by light, it has a great advantage over the conventional GO reducing processes in that it readily allows photo-patterning. Using a photo-mask, conducting r-GO domains can be patterned on the insulating GO film. Compared to conventional photolithography, flash patterning has an additional advantage in that the exposed areas can also be removed directly by further flashing utilizing the enhanced photothermal effect of graphene or r-GO. Therefore, both patterning and etching can be performed in one production setup by increasing the dose of flash irradiation. In one embodiment of the present invention in connection with FIG. 3, it was demonstrated using a photo-mask with a hollow letter "N". First, the photo-mask was placed on top of a GO film supported by a piece of filter paper (FIG. 3a, left). The exposed area was first flashed, creating a black N on the GO film (FIG. 3a, center). When exposed to relatively higher power flashes, the exposed area can be ablated due to rapid degassing and air expansion, leaving an etched "N" shaped mark in the GO film (FIG. 3a, right).

The properties of GO and its reduction product contrast in many aspects, especially in their solvent processability. GO is well processable in water and alcohols due to the strong electrostatic repulsion between the single layers.[8,16] But r-GO tends to agglomerate in solution due to π-π stacking, greatly limiting the concentration of single layer solutions. For making an r-GO/polymer composite, it would be ideal to make a GO/polymer blend first to take full advantage of the excellent processability of GO. r-GO/polymer composites with near arbitrary loading levels can be rapidly fabricated by flash reduction from a blend of GO and polymer particles according to various embodiments of the present invention.

Figure 4:
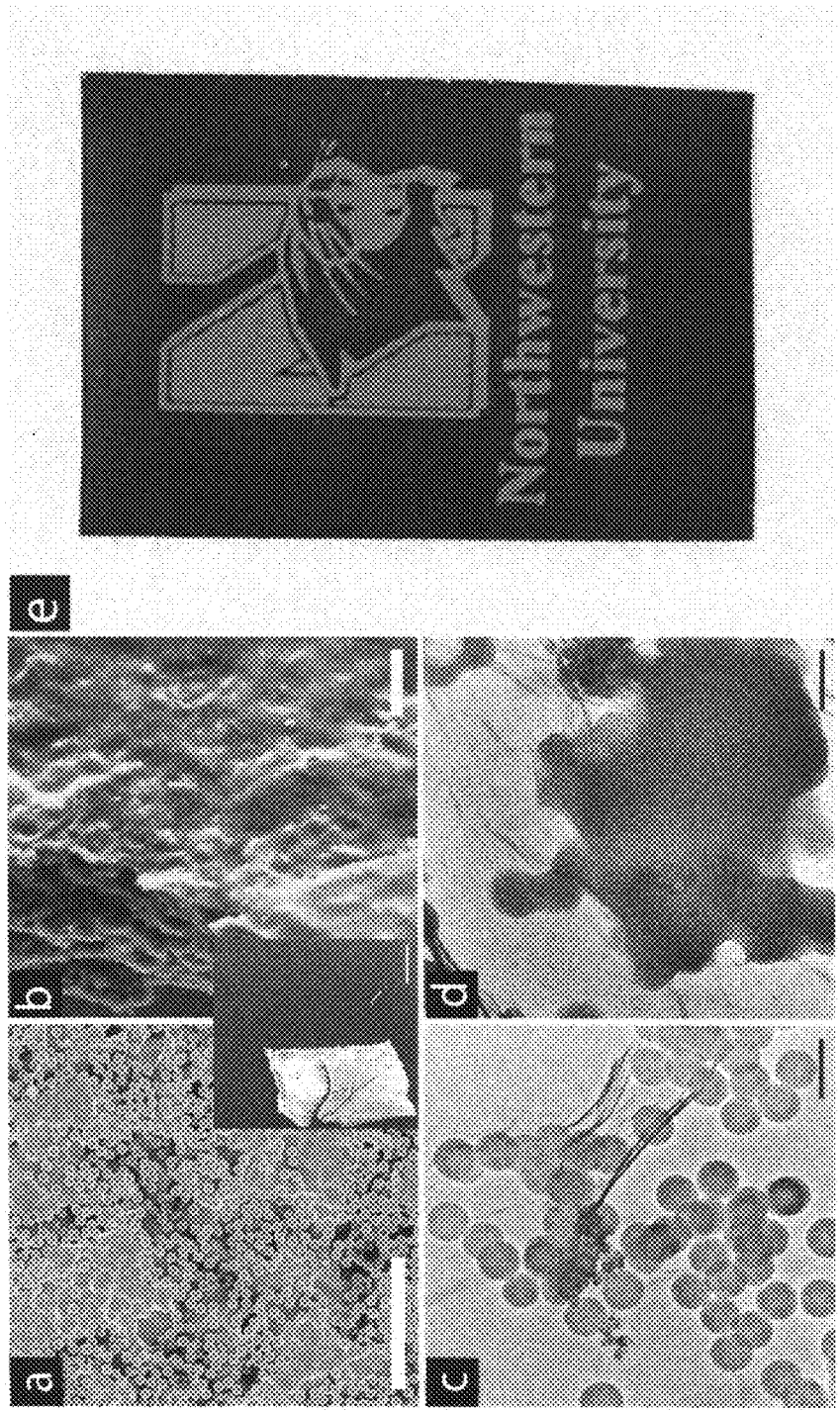
FIG. 4 shows a flash reduction can be utilized to make r-GO/polymer composites from random GO/polymer particle blends as shown in this proof-of-concept experiment. A GO dispersion was mixed with a polystyrene colloidal solution with a predetermined fraction, and then filtered to make a film. The SEM image (a) of such film clearly shows a blend of GO sheets and polystyrene beads. After flashing, polystyrene was fused with r-GO to form a much more homogeneous composite as revealed by the SEM image (b). The inset is a low magnification SEM image showing such a film before (left) and after (right) flash reduction. A strong brightness contrast can be clearly seen due to the great difference in electrical conductivity before and after flash treatment. The TEM images (c: before; d: after) of a sandwiched GO/polystyrene/GO structure clearly show the softening of the polymer colloids due to flash photothermal heating of GO or r-GO. Scale bars in (a, b), (inset), and (c, d) represent 3,500 and 0.5 μm respectively. (e) Complex patterns can be generated with improved resolution on GO/polystyrene films as demonstrated by flash patterning of the Wildcat mascot through a photo-mask printed on an overhead transparency film. The pattern is 14 mm×20 mm.
Figure 5:
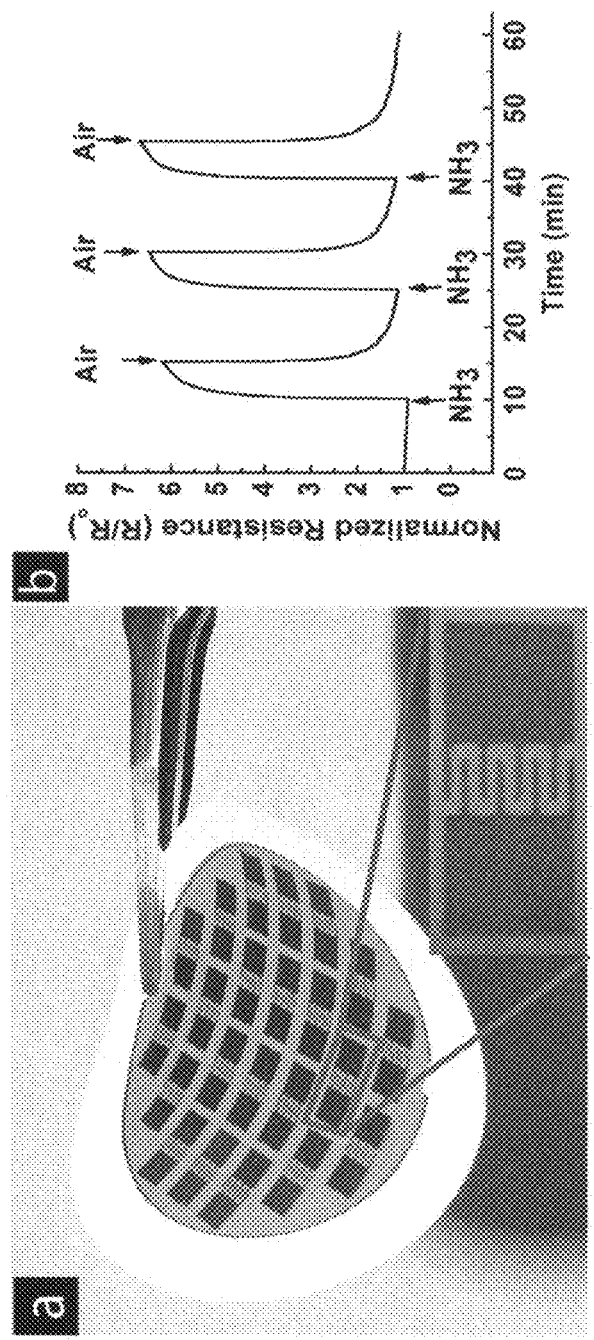
FIG. 5 shows scalable production of functional r-GO based devices on flexible substrates by flash patterning. (a) Arrays of r-GO/polystyrene interdigitated electrodes (IDE) were fabricated on a 1.5 inch diameter GO/polystyrene film deposited on a Nylon filter paper. The inset shows the close up view of one set of such IDE. The contact pads are 5 mm×5 mm. The electrode fingers are 100 μm wide. As a proof of concept, the graphene IDEs were used to construct ammonia sensors with polyaniline as the selective layer. The response from such metal-free, flexible sensor device on exposure to 100 ppm of ammonia vapor is shown in (b).
Figure 6:
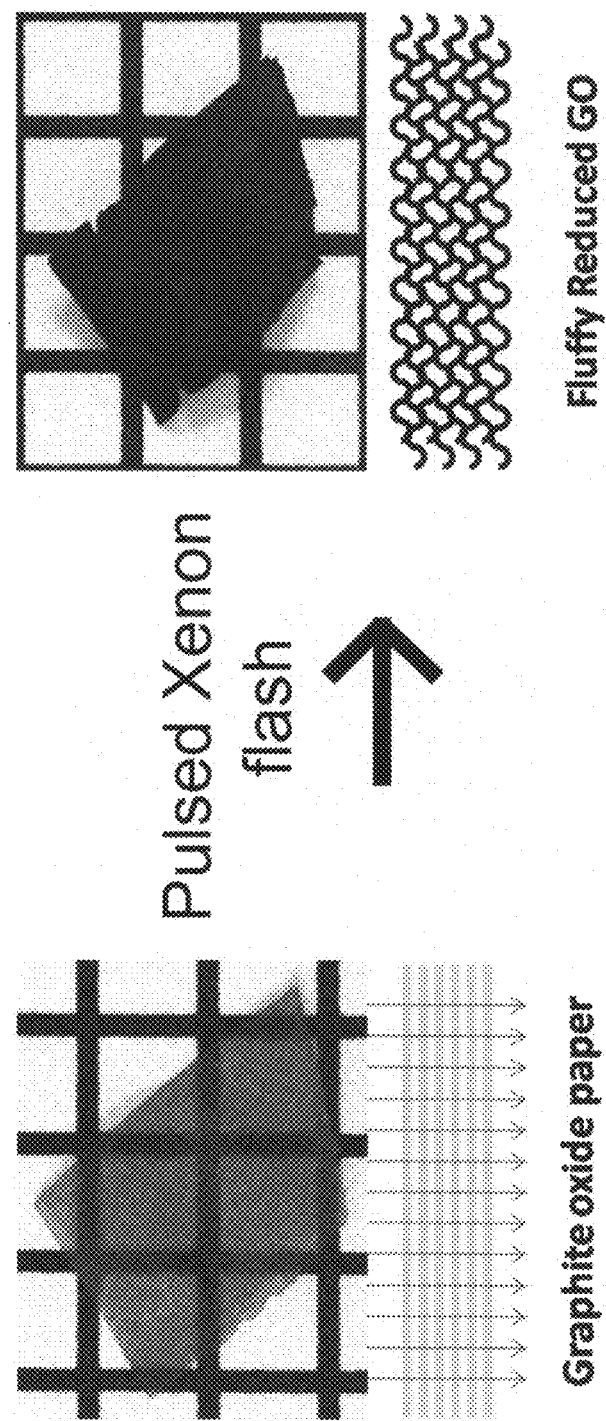
FIG. 6 shows a flash reduction of GO paper to fluffy reduced GO film by pulsed xenon flash according to one embodiment of the present invention.
Figure 7:
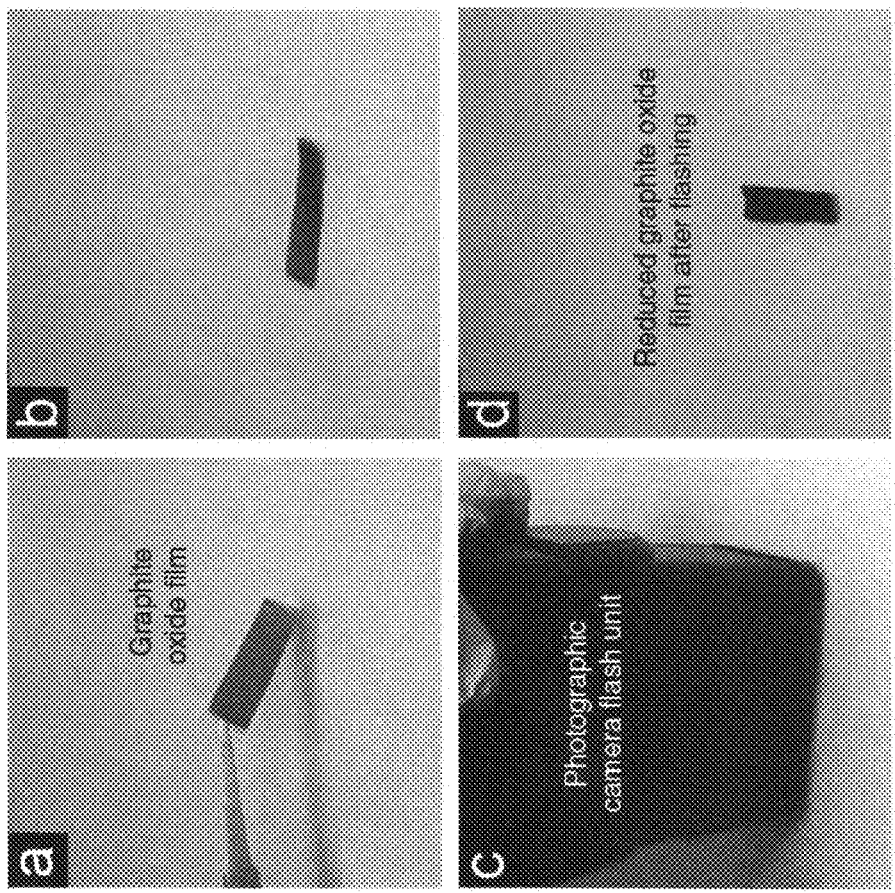
FIG. 7 shows snapshots of a typical flash reduction experiment according to one embodiment of the present invention.
Figure 8:
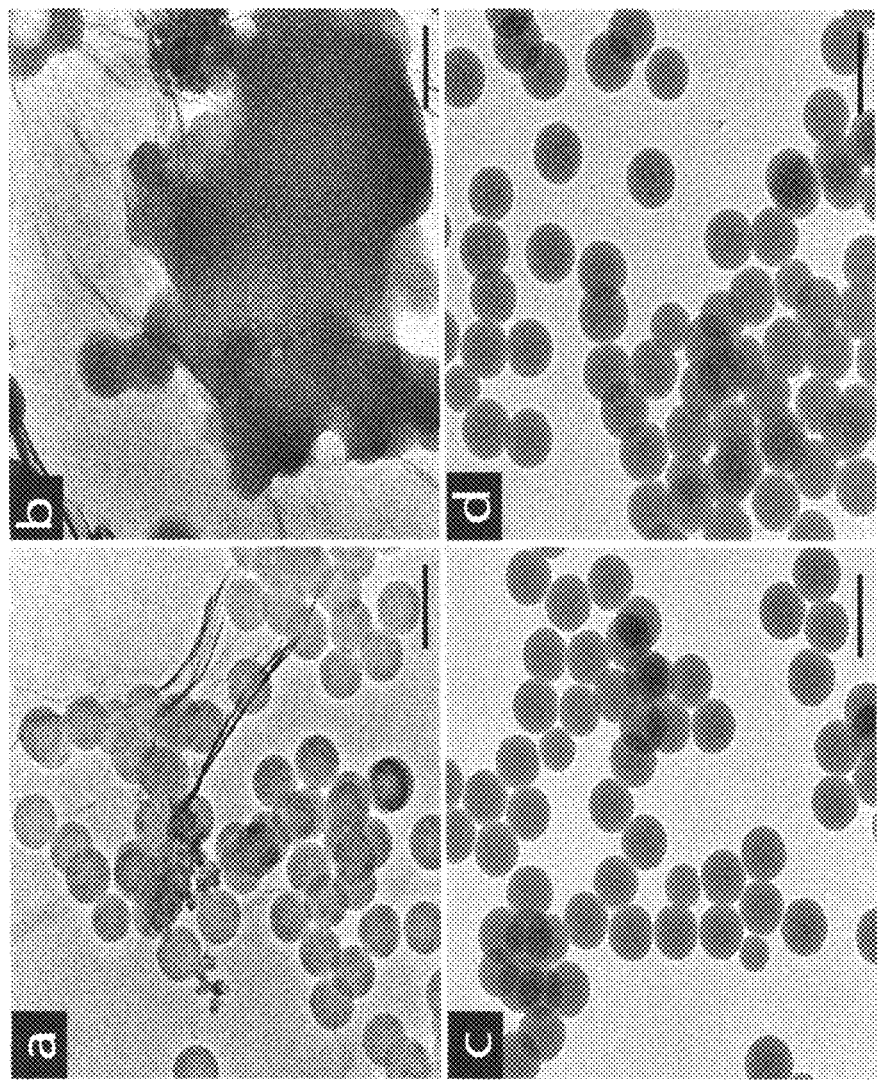
FIG. 8 shows TEM images (a: before; b: after) of a sandwiched GO/polystyrene/GO structure clearly showing the softening of the polymer colloids after flash. The presence of GO sheets can be identified by the wrinkles. Without GO, the polystyrene beads (c: before; d: after) did not appear to be affected by the same flash exposure since polystyrene is transparent in the visible range, and therefore does not have a strong photothermal effect.
Figure 9:
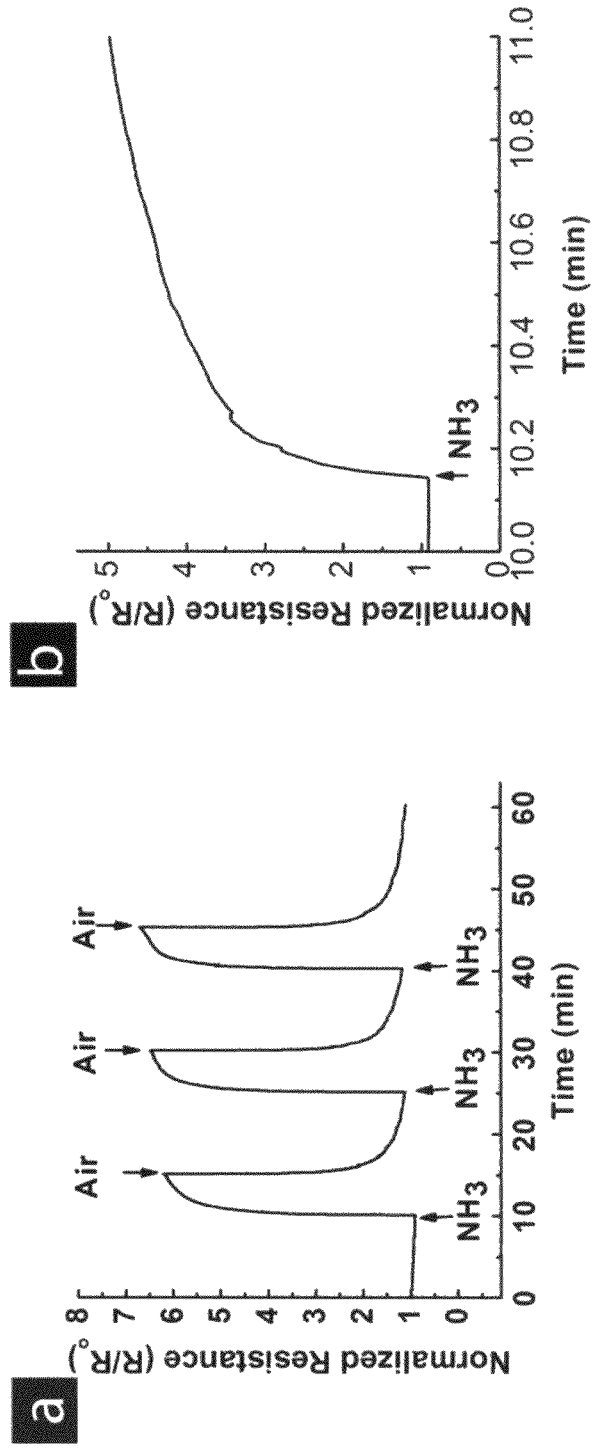
FIG. 9 shows (a) Response of a polyaniline nanofiber sensor deposited on flash patterned r-GO/polystyrene interdigitated electrodes upon exposure to 100 ppm ammonia. (b) is a close up view of the onset of the first cycle, showing the time response. These results are similar to those obtained with conventional metal electrodes on hard substrates[35].

An additional advantage is that the excess heat generated can be utilized to induce welding between the polymer and the r-GO sheets. In one embodiment of the present invention in connection with FIG. 4, GO is flash reduced and welded with polystyrene beads. First, GO single layers and polystyrene colloids were mixed in water with a predetermined fraction. Then films of a GO/polystyrene mixture were made by filtration. Such thin "filter cakes", if detached from the filter paper, were brittle and cracked easily upon manipulation as shown in the low magnification SEM image (FIGS. 4a and 4b, inset). SEM image also revealed a random blend of polystyrene beads with GO (FIG. 4a). After flash irradiation, GO was reduced and the polystyrene particles and GO were fused together, leading to a continuous, conducting film (FIG. 4b and inset). The deformation of polymer colloids can be clearly observed in the TEM images, where the polymer particles were deliberately sandwiched between two GO films using layer by layer deposition (FIG. 4c). The spreading of molten polystyrene on the r-GO sheets was evident after flashing (FIG. 4d). The thickness of each GO film is estimated to be no more than 35 nm based on the widths of the folds. Flash irradiation on these films was able to generate sufficient heat to soften the polystyrene beads. Without GO, flash irradiation had little effect on the colloids (see FIG. 8) since polystyrene is transparent in the visible range. In the GO/polystyrene films, the polymer particles can act as heat sink to drain away the excess heat to avoid over exposure during patterning. This helps to improve the resolution of the patterns and the integrity of the reduced domains. FIG. 4e shows a more complex pattern created on a GO/polystyrene composite film by flashing through a photo-mask printed on an overhead transparency, which depicts the Northwestern University Wildcat® mascot. The finest line in this pattern was about 50 µm.

Because many properties of GO are altered after reduction such as color, electrical conductivity, thermal stability, surface energy, wettability and chemical reactivity, flash reduction and patterning of GO is especially promising for fabricating functional surfaces and devices. For example, FIG. 5a shows arrays of interdigitated r-GO/polystyrene electrodes fabricated on a flexible, 1.5 inch Nylon "wafer" upon flashing through a mask printed on a sheet of overhead transparency. GO/polystyrene blend was used as the precursor to improve the resolution and mechanical durability of the patterned films. The exposed areas became conducting with the sheet resistance decreased significantly from $2 \times 10^8$ Ω*cm to 9.5 k Ω*cm. The flashed areas also became more hydrophobic. Such electrodes were used to construct chemical vapor sensors by depositing some conducting polymer polyaniline nanofibers. When exposed to 100 ppm $NH_3$ vapor, such all-organic, flexible sensors showed comparable sensitivity (FIG. 5b) and time response (FIG. 9) to those made with conventional metal electrodes and hard substrates.[27] The wettability contrast between the electrode fingers and the blank areas may be further utilized to fabricate microfluidic or electrowetting devices.

Advancement in the processing technique can usually bring breakthroughs and discoveries in the materials as seen in the development of carbon nanotubes[28-30] and conducting polymers.[31] Some inspiring results have been reported on flash treatment of nanomaterials such as single walled carbon nanotubes, Si nanowires and conducting polymer nanofibers.[32-34] However, in all these cases it caused the degradation of electrical conductivity. Flash irradiation of GO makes an insulating material conducting, enhancing its electrical conductivity by many orders of magnitude. Therefore, it could lead to many more useful applications. Compared to chemical and high temperature thermal treatments, flash reduction is rapid, chemical-free, and energy efficient. It could be an enabling technique that holds great promise for patterning GO films in device and composite applications.

There are several distinctive differences between the existing technologies and the present invention, which can be summarized in terms of energy, time and conductivity of the resulting materials.

Energy.

In one embodiment of the present invention, it was utilized a common camera unit with a flash power between 0.1 J/cm² and 2 J/cm². Existing technologies illuminated a graphite oxide film with a 300 Xenon lamp for 40 min [US2003/0186059, Page 18 paragraph [0221]] or 500 W ultrahigh pressure mercury lamp was used for at least 20 min (US2003/0186059, Page 18 paragraph [0219] and U.S. Pat. No. 6,828,015 section 14-45). Roughly, the amount of energy input by the mercury lamp is 600 kJ (500 W×1200 s=600 kJ) and 720 kJ with the Xenon lamp, respectively. This is at least three orders of magnitude higher than what is used by practicing the present invention, assuming a maximum exposed area of 100 cm².

Time.

While the existing technologies disclose that light reduction takes about 20 to 40 min ((e.g., US2003/0186059, Page 18 paragraph [0219] and U.S. Pat. No. 6,828,015, paragraphs 14-45), In one embodiment of the present invention, a process occurs typically in milliseconds, which is a process about six orders of magnitude faster than that of existing ones.

Conductivity.

The highest resistivity reported by the known literature is 50 Ohms·cm [e.g., US2003/0186059, Page 18 paragraph [0221], which is 0.02 S/cm in terms of conductivity. In one embodiment of the present invention, the flashed converted graphene has conductivity on the order of 10 S/cm, which is 2 to 3 orders of magnitude better than what is currently available.

Furthermore, the flashing mechanism of the present invention differs in that it uses single light pulse or pulses to generate enough heat to reduce the graphite oxide. The rapid, violent nature of the flashing causes the graphite oxide film to expand and produce a fluffy graphene material, which result in a high surface area graphene material that is critical for high performance electrode materials for batteries and ultracapacitors.

In conclusion, the flash conversion process of this invention uses much less energy, can be done in much shorter time and can produced much better conducting materials than the existing technologies. The differences in all the three aspects set forth above are of several orders of magnitude.

Figure 10:
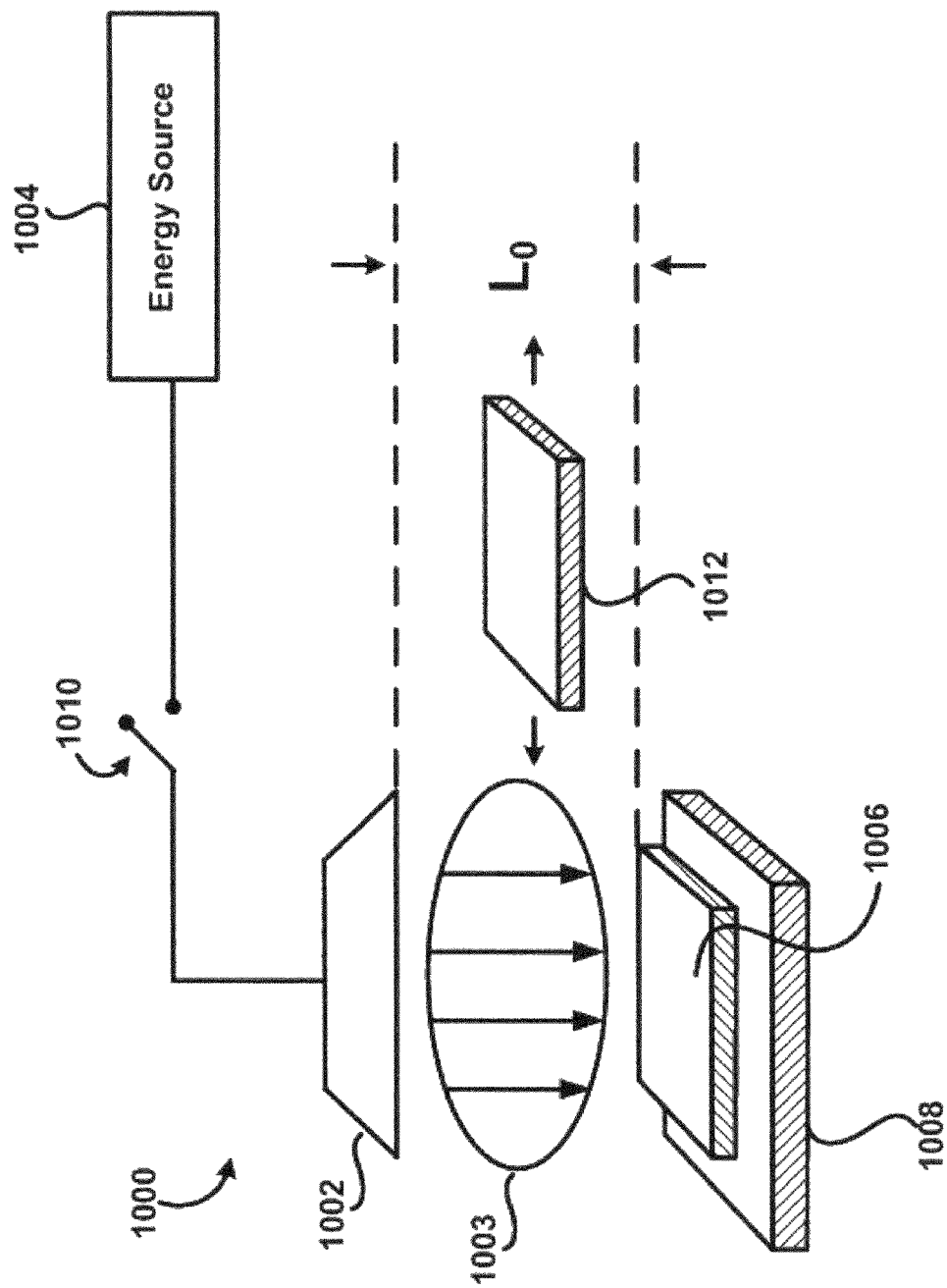
FIG. 10 schematically shows in part a set up for practicing the present invention according to one embodiment of the present invention.
Figure 11:
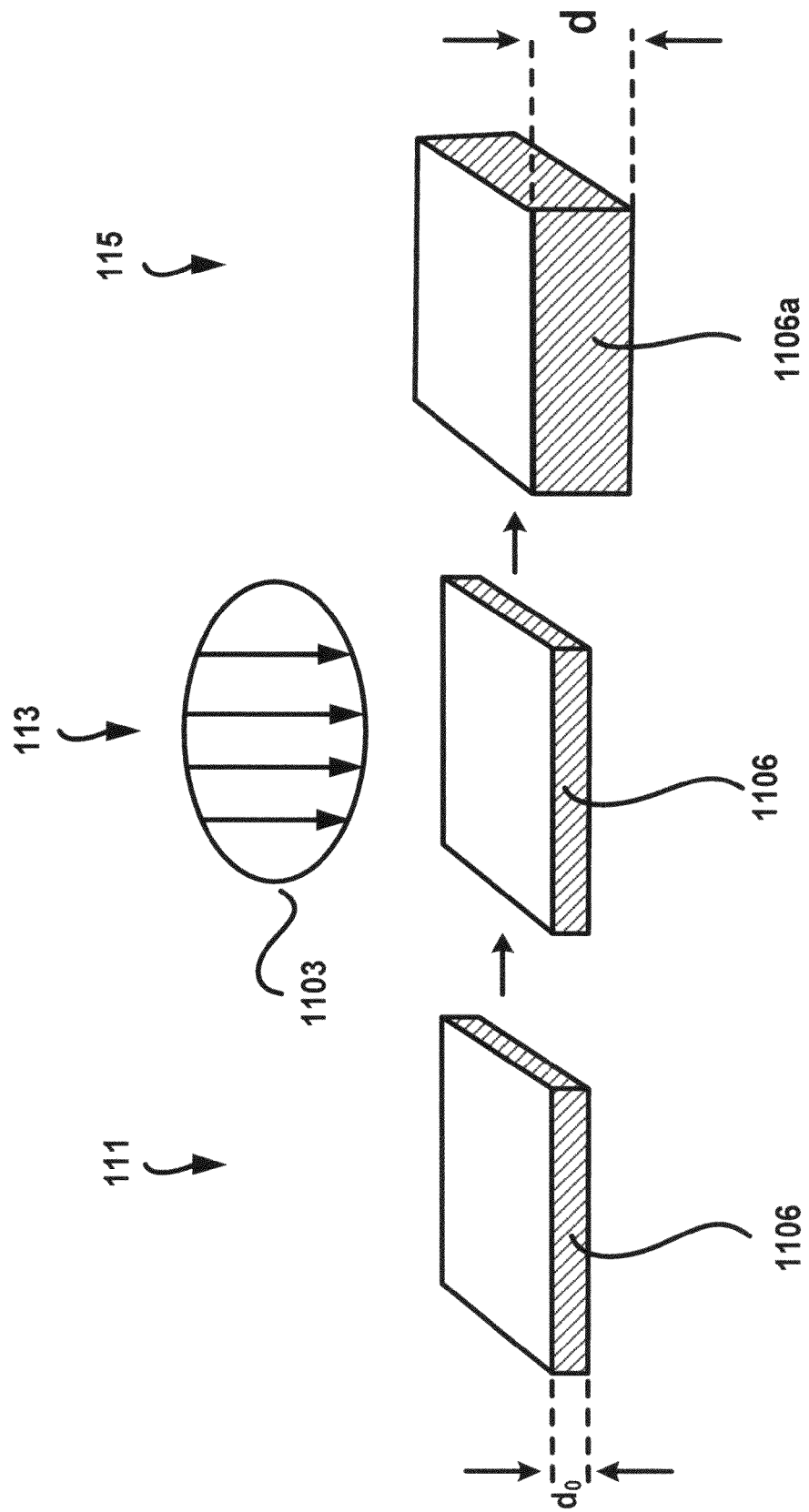
FIG. 11 schematically shows in part of practicing the present invention according to the embodiment as shown in FIG. 10.

Thus, in one aspect, the present invention provides a method 1000 for reducing a film of graphite oxide. In one embodiment as shown in FIGS. 10 and 11, a film 1006, 1106 of graphite oxide with a thickness $d_0$ is provided. Optionally, the film 1006, 1106 can be placed above and supported by a substrate 1008. Optical energy in a single pulse 1003, 1103 is delivered from a light source 1002, which is located at a distance $L_0$ no more than 1.0 cm away from the film 1106 of graphite oxide, to the film 1006/1106 of graphite oxide to reduce the film of graphite oxide to a film of graphene with a thickness d, where the optical energy has a radiant exposure in the range of between 0.1 and 2 J/cm².

In the embodiment as shown in FIG. 11, for example, at step 111, a film 1106 of graphite oxide with a thickness $d_0$ is provided. At step 113, a single pulse 1106 of optical energy irradiates the film 1106 of graphite oxide, which reduces the film 1106 of graphite oxide into a film 1106a of graphene with a thickness d at step 115. The thickness d is greater than the thickness $d_0$. In various embodiments of the present invention, the thickness $d \geq 10 \times d_0$.

Still referring to FIG. 10, the optical energy is delivered in a single pulse 1003 from a light source 1002, which may be electrically coupled to an energy source 1004 such as a battery or an electric current output. An on/off switch 1010 can be used to turn on, turn off, and/or control the irradiation time of the light source 1002. Moreover, a light absorbing member 1012, such as a glass slide, may be utilized move in or move out in between the film 1006 and the light source 1002 to adjust the dose of exposure of optical energy to the film 1006. It is further noted that the dose of exposure of optical energy to the film 1006 can also be adjusted by changing the distance $L_0$ (by moving the position of the light source 1002, or the position of the film 1006, or both) and/or changing the intensity of the optical energy irradiated by the light source 1002. A computer (not shown) may be utilized to be in communication with the light source 1002, the switch 1010, the energy source 1004, the film 1006, the substrate 1008 (that could be placed on a movable/controllable platform (not shown)), and the optional light absorbing member 1012, or at least some of them, to coordinate the process according to the various embodiments of the present invention.

Various types of light sources can be utilized as long as they can deliver sufficient optical energy in pulse or pulses to the target film such as the film of GO. In one embodiment, the light source 1002 is a flash light, and the single pulse of the optical energy is a flash of light that irradiates the film of graphite oxide in a sufficient short period of time to cause a photoacoustic response from the film of graphite oxide to the irradiation of the flash of the light. The period of time during which the film of graphite oxide is exposed to the single flash of light is less than $1.0 \times 10^{-5}$ seconds.

In one embodiment, the method further has the step of delivering optical energy in at least one additional pulse to the film of graphite oxide at a distance no more than 1.0 cm away from the film of graphite oxide. Moreover, the step of delivering optical energy in at least one additional pulse includes delivering optical energy in a plurality of pulses in sequential steps. The tonal number of pulses of optical energy or light delivered is depending on the desired result from the target film.

The present invention, as a whole or in part, can be practiced in an ambient air atmosphere. Alternatively, it can be performed in a nitrogen atmosphere.

In one embodiment, a dispersion of the film of graphite oxide is irradiated by the optical energy.

In another aspect, the present invention provides an article of manufacture made by the method as set forth above, namely, a conducting film 1106a of graphene.

In yet another aspect, the present invention provides a method for reducing a composite film of graphite oxide and polymer. In one embodiment, the method includes the steps of:

(a) providing a composite film of graphite oxide and polymer; and (b) delivering optical energy in a single pulse to the composite film of graphite oxide and polymer at a distance no more than 1.0 cm away from the composite film of graphite oxide and polymer to reduce the composite film of graphite oxide and polymer to a film of graphene and polymer, wherein the optical energy has a radiant exposure in the range of between 0.1 and 2 J/cm$^2$.

The optical energy is delivered in a single pulse from a light source. In one embodiment, the light source is a flash light, and the single pulse of the optical energy is a flash of light that irradiates the composite film of graphite oxide and polymer in a sufficient short period of time. The period of time during which the composite film of graphite oxide and polymer is exposed to the single flash of light is less than $1.0 \times 10^{-5}$ seconds.

In one embodiment, the method further has the step of delivering optical energy in at least one additional pulse to the composite film of graphite oxide and polymer at a distance no more than 1.0 cm away from the composite film of graphite oxide and polymer. Moreover, the step of delivering optical energy in at least one additional pulse comprises delivering optical energy in a plurality of pulses in sequential steps.

In one embodiment, the step (b) of the method immediately set forth above is performed in an ambient air atmosphere.

In another embodiment, the step (b) of the method immediately set forth above is performed in a nitrogen atmosphere.

In one embodiment, the composite film of graphite oxide and polymer is supported by a substrate.

In one embodiment, the polymer includes polystyrene particles or beads. Other polymers can also be utilized to practice the present invention. The optical energy delivered to the composite film of graphite oxide and polymer in the sufficient short period of time causes heat generated and transferred from the graphite oxide to the polystyrene particles or beads to melt the polystyrene particles or beads to form a conducting film.

In one embodiment, the method further includes the steps of:

(a1) mixing a dispersion of graphite oxide with a colloidal solution of a desired polymer to form a mixture; and (a2) filtering the mixture to make a composite film of graphite oxide.

In another aspect, the present invention provides an article of manufacture made by the method as set forth immediately above.

In a further aspect, the present invention provides a method for making a conductive film with a pattern from graphite oxide. In one embodiment, the method includes the steps of:

(a) providing a film of graphite oxide;

(b) over the film of graphite oxide placing a mask with a plurality of windows that are transparent to optical energy, wherein the plurality of windows is arranged according to a desired pattern; and (c) delivering optical energy in a single pulse to the mask to irradiate the film of graphite oxide by the optical energy passing through the plurality of windows of the mask at a distance no more than 1.0 cm away from the film of graphite oxide to reduce the film of graphite oxide to a conducting film of graphene with a pattern, wherein the optical energy has a radiant exposure in the range of between 0.1 and 2 J/cm$^2$, and wherein the thickness d is greater than the thickness $d_0$.

The optical energy is delivered in a single pulse from a light source. In one embodiment, the light source is a flash light, and the single pulse of the optical energy is a flash of light that irradiates the film of graphite oxide through the plurality of windows of the mask in a sufficient short period of time. The period of time during which the film of graphite oxide is exposed through the plurality of windows of the mask to the single flash of light is less than $1.0 \times 10^{-5}$ seconds.

In one embodiment, the method further has the step of delivering optical energy in at least one additional pulse to the mask to irradiate the film of graphite oxide by the optical energy passing through the plurality of windows of the mask. Moreover, the step of delivering optical energy in at least one additional pulse comprises delivering optical energy in a plurality of pulses in sequential steps.

In one embodiment, the conducting film of graphene with a pattern as formed has a conducting area and an insulating area, and wherein the conducting area is formed with a pattern corresponding to the plurality of windows is arranged according to a desired pattern by being exposed to the optical energy delivered through the plurality of windows of the mask, and the insulating area is formed corresponding to the areas of the mask where the plurality of windows are not located at, respectively.

In one embodiment, the conducting area has an array of electrodes.

In another aspect, the present invention provides an article of manufacture made by the method as set forth immediately above, namely, the conducting film of graphene with a pattern, which can find many uses in electronics.

In yet another aspect, the present invention provides a method for making a conductive film with a pattern from composite film of graphite oxide and polymer. In one embodiment, the method includes the steps of:

(a) providing a composite film of graphite oxide and polymer;

(b) over the composite film of graphite oxide and polymer placing a mask with a plurality of windows that are transparent to optical energy, wherein the plurality of windows is arranged according to a desired pattern; and (c) delivering optical energy in a single pulse to the mask to irradiate the composite film of graphite oxide and polymer by the optical energy passing through the plurality of windows of the mask at a distance no more than 1.0 cm away from the composite film of graphite oxide and polymer to reduce the composite film of graphite oxide and polymer to a conducting film of graphene and polymer with a pattern, wherein the optical energy has a radiant exposure in the range of between 0.1 and 2 J/cm$^2$, and wherein the thickness d is greater than the thickness $d_0$.

The optical energy is delivered in a single pulse from a light source. In one embodiment, the light source is a flash light, and the single pulse of the optical energy is a flash of light that irradiates the composite film of graphite oxide and polymer through the plurality of windows of the mask in a sufficient short period of time. The period of time during which the composite film of graphite oxide and polymer is exposed through the plurality of windows of the mask to the single flash of light is less than $1.0 \times 10^{-5}$ seconds.

In one embodiment, the method further has the step of delivering optical energy in at least one additional pulse to the mask to irradiate the composite film of graphite oxide and polymer by the optical energy passing through the plurality of windows of the mask. Moreover, the step of delivering optical energy in at least one additional pulse comprises delivering optical energy in a plurality of pulses in sequential steps.

In one embodiment, the conducting film of graphene and polymer with a pattern as formed has a conducting area and an insulating area, and wherein the conducting area is formed with a pattern corresponding to the plurality of windows is arranged according to a desired pattern by being exposed to the optical energy delivered through the plurality of windows of the mask, and the insulating area is formed corresponding to the areas of the mask where the plurality of windows are not located at, respectively.

In one embodiment, the conducting area has an array of electrodes.

In another aspect, the present invention provides an article of manufacture made by the method as set forth immediately above, namely, the conducting film of graphene and polymer with a pattern, which can find many applications in, for examples, electronics

EXAMPLES

Aspects of the present teachings may be further understood in light of the following examples, which should not be construed as limiting the scope of the present teachings in any way.

Materials Synthesis

Graphite oxide was prepared using a modified Hummer's method from graphite powders[2,7,8,16,17] (Bay carbon, SP-1) using $NaNO_3$, $H_2SO_4$ and $KMnO_4$ in an ice bath as reported in great detail elsewhere.[16] A stock solution of GO single layers (0.17 mg/ml) was obtained after multiple sedimentation steps to remove unexfoliated materials. GO films were obtained by filtration or casting. To obtain free standing films, the stock solution was filtered through a 47 mm diameter anodized aluminum oxide (AAO) membrane with a nominal pore size of 0.02 μm. The GO film can be peeled off the AAO filter after drying in air. A thus prepared free standing GO film is 34 mm in diameter, 1 μm in thickness, and typically weighed about 1.7 mg. Filtration using cellulose nitrate or Nylon filter papers gave supported GO films.

Polystyrene colloids with average diameters of 300 nm were synthesized by suspension polymerization according to a reported procedure.[18] A stock solution of about 1.4 wt % of polystyrene beads was obtained after purification. Since both GO colloids and polystyrene colloids are processable in water, they can be mixed with any fraction to produce a blend with nearly arbitrary GO loading. GO/polystyrene composite films were prepared by filtering their mixed colloidal dispersion through Nylon (0.45 μm pore size) or AAO filters (0.2 μm nominal pore size) and dried at room temperature. Before flashing, the films were dried for another 10 min in a 90° C. oven to remove residual water.

Flash Reduction of GO

Most of the flash reduction experiments were carried out in air. Under $N_2$ atmosphere inside a glove box, however, it was found that lower flash energy (indicated by the f/stops on the flash units) was needed to achieve reduction. This was attributed to more effective heating of GO due to reduced water content in GO. Flash reduction of free standing GO films can be done with a single, close-up (<1 cm) flash from the Xenon lamp equipped on a common digital camera. Most experiments were done with a Sunpak 383 stand-alone flash unit with a larger window size of around 30 mm×50 mm. The interdigitated electrodes arrays on the 1.5 inch diameter GO/polystyrene film (FIG. 5) were flashed patterned using an Alien Bees B1600 unit equipped with a 7 inch diameter reflector. The flash energies were measured using a Gentec QE25ELP flash lamp measurement system. The typical flash energies applied to the samples were in a range of around 0.1 to 2 J/cm$^2$. In order to improve the uniformity and contrast of the patterns, multiple flashes of lower energy were applied until the desired color was reached. Supported GO films tended to form cracks when exposed to high power flashes due to volume shrinkage and rapid degassing. In order to obtain crack-free, uniform r-GO domains on the supported GO films, a low power, pulsed curing system (Xenon Corporation, RC-250B) was used to obtain the N shaped pattern shown in the middle of FIG. 3. This system emits relatively low energy pulses at a frequency of 120 Hz. The exposure time was adjusted to obtain the best reduced GO pattern. A few sequential pulses from the photographic units can often burn away the exposed area (FIG. 3, right). GO/polystyrene blends tended to give better defined patterns and more durable reduced GO films due to the heat sink effect of the non-absorbing polystyrene spheres, which melt to fuse with the r-GO sheets. Photo-masks for flash patterning were either made by paper punches (FIG. 3) or printed on overhead transparency films. The dose of exposure can be adjusted by changing the relative power range (the f/stops on the flash units), the distance between the sample and the lamp, or by inserting light absorbing layers (e.g., glass slides) in between the sample and the lamp.

Sample Characterization

Thermogravimetric analysis (TGA) of the samples was carried out in a Mettler Toledo TGA/SDTA851 under $N_2$ atmosphere with a heating rate of 5° C./min. Differential scanning calorimetry (DSC) was carried out on a Perkin-Elmer DSC-7 under $N_2$ atmosphere with a heating rate of 5° C./min. The Fourier transform infrared spectra (FTIR) were acquired in transmission mode on a Nicolet Nexus 870 FTIR spectrophotometer. X-ray diffraction (XRD) patterns were obtained using an INEL CPS120 powder diffractometer with Cu $K_\alpha$ radiation. Water contact angle was measured using a Krüss DSA100 drop shape analyzer. Free-standing GO films of about 1.0 μm in thickness and their reduction products were used in all these characterization techniques. Scanning electron microscopy (SEM) images were taken on a FEI Nova 600 SEM. For the insulating GO/polystyrene particle samples as the one shown in FIG. 4a, a 10 nm Au/Pd layer was sputtered before imaging to avoid charging. Transmission electron microscopy (TEM) images were taken on a Hitachi H-8100 TEM at 200 kV. Optical microscopy studies were carried out on a Nikon Eclipse E600 POL microscope under reflectance mode. Sheet resistance measurements were taken using the four point probe technique with a Keithley 2601 source meter. Elemental analysis was performed by Atlantic Microlab, Inc., Norcross, Ga. using combustion (carbon, hydrogen) and pyrolysis (oxygen) based analysis.

Ammonia Sensing

Polyaniline nanofibers were prepared according to previously reported methods[19]. A drop of polyaniline nanofibers aqueous dispersion was cast on the fingers of a set of flash patterned, r-GO/polystyrene interdigitated electrodes. Ammonia sensing experiments were conducted in a headspace system. The resistance of the polyaniline nanofibers was monitored using a Keithley 2601 source meter at 7 Hz data acquisition rate.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

REFERENCES (1) Li, D.; Kaner, R. B. *Science* 2008, 320, 1170-1171.
(2) Hummers, W. S.; Offeman, R. E. *J. Am. Chem. Soc.* 1958, 80, 1339-1339.
(3) Nakajima, T.; Mabuchi, A.; Hagiwara, R. *Carbon* 1988, 26, 357-361.
(4) Nakajima, T.; Matsuo, Y. *Carbon* 1994, 32, 469-475.
(5) Cai, W. W.; Piner, R. D.; Stadermann, F. J.; Park, S.; Shaibat, M. A.; Ishii, Y.; Yang, D. X.; Velamakanni, A.; An, S. J.; Stoller, M.; An, J. H.; Chen, D. M.; Ruoff, R. S. *Science* 2008, 321, 1815-1817.
(6) Stankovich, S.; Dikin, D. A.; Dommett, G. H. B.; Kohlhaas, K. M.; Zimney, E. J.; Stach, E. A.; Piner, R. D.; Nguyen, S. T.; Ruoff, R. S, *Nature* 2006, 442, 282-286.
(7) Stankovich, S.; Dikin, D. A.; Piner, R. D.; Kohlhaas, K. A.; Kleinhammes, A.; Jia, Y.; Wu, Y.; Nguyen, S. T.; Ruoff, R. S. *Carbon* 2007, 45, 1558-1565.
(8) Gilje, S.; Han, S.; Wang, M.; Wang, K. L.; Kaner, R. B. *Nano Lett.* 2007, 7, 3394-3398.
(9) Li, D.; Muller, M. B.; Gilje, S.; Kaner, R. B.; Wallace, G. G. *Nature Nanotech.* 2008, 3, 101-105.
(10) Eda, G.; Fanchini, G.; Chhowalla, M. *Nature Nanotech.* 2008, 3, 270-274.
(11) Tung, V. C.; Allen, M. J.; Yang, Y.; Kaner, R. B. *Nature Nanotech.* 2009, 4, 25-29.
(12) Becerril, H.; xe; ctor, A.; Mao, J.; Liu, Z.; Stoltenberg, R. M.; Bao, Z.; Chen, Y. *ACS Nano* 2008, 2, 463-470.
(13) Schniepp, H. C.; Li, J. L.; McAllister, M. J.; Sai, H.; Herrera-Alonso, M.; Adamson, D. H.; Prud'homme, R. K.; Car, R.; Saville, D. A.; Aksay, I. A. *J. Phys. Chem. B* 2006, 110, 8535-8539.
(14) Gomez-Navarro, C.; Weitz, R. T.; Bittner, A. M.; Scolari, M.; Mews, A.; Burghard, M.; Kern, K. *Nano Lett.* 2007, 7, 3499-3503.
(15) Wang, X.; Zhi, L. J.; Mullen, K. *Nano Lett.* 2008, 8, 323-327.
(16) Cote, L. J.; Kim, F.; Huang, J. *J. Am. Chem. Soc.* 2009, 131, 1043-1049.
(17) Kovtyukhova, N.; Buzaneva, E.; Senkevich, A. *Carbon* 1998, 36, 549-554.
(18) Zou, D.; Derlich, V.; Gandhi, K.; Park, M.; Sun, L.; Kriz, D.; Lee, Y. D.; Kim, G.; Aklonis, J. J.; Salovey, R. *J. Polym. Sci., Part A: Polym. Chem.* 1990, 28, 1909-1921.
(19) Huang, J. X. *Pure Appl. Chem.* 2006, 78, 15-27.
(20) Rosencwaig, A. *Photoacoustics and Photoaccoustic Spectroscopy*; Wiley: New York, 1990.
(21) Leitner, T.; Kattner, J.; Hoffmann, H. *Appl. Spectrosc.* 2003, 57, 1502-1509.
(22) Dikin, D. A.; Stankovich, S.; Zimney, E. J.; Piner, R. D.; Dommett, G. H. B.; Evmenenko, G.; Nguyen, S. T.; Ruoff, R. S, *Nature* 2007, 448, 457-460.
(23) Fujimoto, H. *Carbon* 2003, 41, 1585-1592.
(24) Xu, Y. X.; Bai, H.; Lu, G. W.; Li, C.; Shi, G. Q. *J. Am. Chem. Soc.* 2008, 130, 5856-5857.
(25) Stoller, M. D.; Park, S. J.; Zhu, Y. W.; An, J. H.; Ruoff, R. S, *Nano Lett.* 2008, 8, 3498-3502.
(26) Si, Y.; Samulski, E. T. *Nano Lett.* 2008, 8, 1679-1682.
(27) Huang, J. X.; Virji, S.; Weiller, B. H.; Kaner, R. B. *J. Am. Chem. Soc.* 2003, 125, 314-315.
(28) Banerjee, S.; Hemraj-Benny, T.; Wong, S. S. *Adv. Mater.* 2005, 17, 17-29.
(29) Liu, J.; Fan, S. S.; Dai, H. J. *MRS Bulletin* 2004, 29, 244-250.
(30) Sun, Y. P.; Fu, K. F.; Lin, Y.; Huang, W. J. *Acc. Chem. Res.* 2002, 35, 1096-1104.
(31) Skotheim, T. A.; Reynolds, J. R. *Handbook of conducting polymers;* 3rd ed.; CRC: London, 2007.
(32) Ajayan, P. M.; Terrones, M.; de la Guardia, A.; Huc, V.; Grobert, N.; Wei, B. Q.; Lezec, H.; Ramanath, G.; Ebbesen, T. W. *Science* 2002, 296, 705-705.

(33) Wang, N.; Yao, B. D.; Chan, Y. F.; Zhang, X. Y. *Nano Lett.* 2003, 3, 475-477.
(34) Huang, J. X.; Kaner, R. B. *Nature Mater.* 2004, 3, 783-786.
(35) Huang, J. X., Virji, S., Weiller, B. H. & Kaner, R. B. *J. Am. Chem. Soc.* 125, 314-315 (2003).

What is claimed is:

1. A method for reducing a film of graphite oxide, comprising:
   (a) providing a film of graphite oxide with a thickness $d_0$; and
   (b) delivering optical energy in a single pulse from a flash lamp to the film of graphite oxide at a distance no more than 1.0 cm away from the film of graphite oxide to reduce the film of graphite oxide to a film of graphene with a thickness d,
   wherein the optical energy has a radiant exposure in the range of between 0.1 and 2 J/cm$^2$, and wherein the thickness d is greater than the thickness $d_0$.

2. The method of claim 1, wherein the single pulse of the optical energy is a flash of light from the flash lamp that irradiates the film of graphite oxide in a period of time to cause a photoacoustic response from the film of graphite oxide.

3. The method of claim 2, wherein the period of time is less than $1.0 \times 10^{-5}$ seconds.

4. The method of claim 1, further comprising the step of delivering optical energy in at least one additional pulse to the film of graphite oxide at a distance no more than 1.0 cm away from the film of graphite oxide.

5. The method of claim 4, wherein the step of delivering optical energy in at least one additional pulse comprises delivering optical energy in a plurality of pulses in sequential steps.

6. The method of claim 1, wherein the steps (a) and (b) are performed in an ambient air atmosphere.

7. The method of claim 1, wherein the steps (a) and (b) are performed in a nitrogen atmosphere.

8. The method of claim 1, wherein a dispersion of the film of graphite oxide is irradiated by the optical energy.

9. The method of claim 1, wherein the film of graphite oxide is supported by a substrate.

10. The method of claim 1, wherein the thickness $d \geq 10 \times d_0$.

11. A method for reducing a composite film of graphite oxide and polymer, comprising:
    (a) providing a composite film of graphite oxide and polymer; and
    (b) delivering optical energy in a single pulse from a flash lamp to the composite film of graphite oxide and polymer at a distance no more than 1.0 cm away from the composite film of graphite oxide and polymer to reduce the composite film of graphite oxide and polymer to a film of graphene and polymer,
    wherein the optical energy has a radiant exposure in the range of between 0.1 and 2 J/cm$^2$.

12. The method of claim 11, wherein the single pulse of the optical energy is a flash of light from the flash lamp that irradiates the composite film of graphite oxide and polymer in a period of time.

13. The method of claim 12, wherein the period of time is less than $1.0 \times 10^{-5}$ seconds.

14. The method of claim 11, further comprising the step of delivering optical energy in at least one additional pulse to the composite film of graphite oxide and polymer at a distance no more than 1.0 cm away from the composite film of graphite oxide and polymer.

15. The method of claim 14, wherein the step of delivering optical energy in at least one additional pulse comprises delivering optical energy in a plurality of pulses in sequential steps.

16. The method of claim 11, wherein the step (b) is performed in an ambient air atmosphere.

17. The method of claim 11, wherein the step (b) is performed in a nitrogen atmosphere.

18. The method of claim 11, wherein the composite film of graphite oxide and polymer is supported by a substrate.

19. The method of claim 11, wherein the polymer comprises polystyrene particles or beads.

20. The method of claim 19, wherein the optical energy delivered to the composite film of graphite oxide and polymer in a period of time causes heat generated and transferred from the graphite oxide to the polystyrene particles or beads to melt the polystyrene particles or beads to form a conducting film.

21. The method of claim 11, further comprising the steps of:
    (a1) mixing a dispersion of graphite oxide with a colloidal solution of a desired polymer to form a mixture; and
    (a2) filtering the mixture to make the composite film of graphite oxide and polymer.

22. A method for making a conductive film with a pattern from graphite oxide, comprising:
    (a) providing a film of graphite oxide;
    (b) over the film of graphite oxide placing a mask with a plurality of windows that are transparent to optical energy, wherein the plurality of windows is arranged according to a desired pattern; and
    (c) delivering optical energy in a single pulse from a flash lamp through the mask to irradiate the film of graphite oxide by the optical energy passing through the plurality of windows of the mask at a distance no more than 1.0 cm away from the film of graphite oxide to reduce the film of graphite oxide to a conducting film of graphene with a pattern,
    wherein the optical energy has a radiant exposure in the range of between 0.1 and 2 J/cm$^2$, and wherein the thickness d of the conducting film of graphene is greater than the thickness $d_0$ of the film of graphite oxide.

23. The method of claim 22, wherein the single pulse of the optical energy is a flash of light from the flash lamp that irradiates the film of graphite oxide through the plurality of windows of the mask in a period of time.

24. The method of claim 23, wherein the period of time is less than $1.0 \times 10^{-5}$ seconds.

25. The method of claim 22, further comprising the step of delivering optical energy in at least one additional pulse to the mask to irradiate the film of graphite oxide by the optical energy passing through the plurality of windows of the mask.

26. The method of claim 25, wherein the step of delivering optical energy in at least one additional pulse comprises delivering optical energy in a plurality of pulses in sequential steps.

27. The method of claim 22, wherein the conducting film of graphene with a pattern as formed has a conducting area and an insulating area, and wherein the conducting area is formed with a pattern corresponding to the plurality of windows is arranged according to a desired pattern by being exposed to the optical energy delivered through the plurality of windows of the mask, and the insulating area is formed corresponding to the areas of the mask where the plurality of windows are not located at, respectively.

28. The method of claim 27, wherein the conducting area forms an array of electrodes.

29. A method for making a conductive film with a pattern from composite film of graphite oxide and polymer, comprising:
(a) providing a composite film of graphite oxide and polymer;
(b) over the composite film of graphite oxide and polymer placing a mask with a plurality of windows that are transparent to optical energy, wherein the plurality of windows is arranged according to a desired pattern; and
(c) delivering optical energy in a single pulse from a flash lamp to the mask to irradiate the composite film of graphite oxide and polymer by the optical energy passing through the plurality of windows of the mask at a distance no more than 1.0 cm away from the composite film of graphite oxide and polymer to reduce the composite film of graphite oxide and polymer to a conducting film of graphene and polymer with a pattern,
wherein the optical energy has a radiant exposure in the range of between 0.1 and 2 J/cm$^2$, and wherein the thickness d of the conducting film of graphene is greater than the thickness $d_0$ of the film of graphite oxide.

30. The method of claim 29, wherein the single pulse of the optical energy is a flash of light from the flash lamp that irradiates the composite film of graphite oxide and polymer through the plurality of windows of the mask in a period of time.

31. The method of claim 30, wherein the period of time is less than $1.0 \times 10^{-5}$ seconds.

32. The method of claim 29, further comprising the step of delivering optical energy in at least one additional pulse to the mask to irradiate the composite film of graphite oxide and polymer by the optical energy passing through the plurality of windows of the mask.

33. The method of claim 32, wherein the step of delivering optical energy in at least one additional pulse comprises delivering optical energy in a plurality of pulses in sequential steps.

34. The method of claim 29, wherein the conducting film of graphene and polymer with a pattern as formed has a conducting area and an insulating area, and wherein the conducting area is formed with a pattern corresponding to the plurality of windows is arranged according to a desired pattern by being exposed to the optical energy delivered through the plurality of windows of the mask, and the insulating area is formed corresponding to the areas of the mask where the plurality of windows are not located at, respectively.

35. The method of claim 34, wherein the conducting area forms an array of electrodes.

* * * * *